United States Patent
Miles (10) Patent No.: US 10,359,859 B2
(45) Date of Patent: *Jul. 23, 2019

(54) CONTROL PANEL

(71) Applicant: Lawo Holding AG, Rastatt (DE)

(72) Inventor: Alex Miles, London (GB)

(73) Assignee: LAWO HOLDING AG, Rastatt (DE)

(*) Notice: Subject to any disclaimer, the term of this patent is extended or adjusted under 35 U.S.C. 154(b) by 118 days.

This patent is subject to a terminal disclaimer.

(21) Appl. No.: 15/437,012

(22) Filed: Feb. 20, 2017

(65) Prior Publication Data

US 2017/0160822 A1    Jun. 8, 2017

Related U.S. Application Data (62) Division of application No. 14/373,266, filed as application No. PCT/GB2013/000008 on Jan. 9, 2013, now Pat. No. 9,626,004.

(30) Foreign Application Priority Data

Jan. 22, 2012 (GB) .................................. 1201025.2
Jan. 22, 2012 (GB) .................................. 1207435.7
Aug. 16, 2012 (GB) .................................. 1214660.1

(51) Int. Cl.
*G09G 5/00* (2006.01)
*G06F 3/02* (2006.01)
(Continued)

(52) U.S. Cl.
CPC ............. *G06F 3/0202* (2013.01); *G05G 1/08* (2013.01); *G06F 3/0312* (2013.01);
(Continued)

(58) Field of Classification Search
CPC ....... G05G 1/08; G06F 3/0202; G06F 3/0312; G06F 3/0362; G06F 3/0421;
(Continued)

(56) References Cited

U.S. PATENT DOCUMENTS 5,777,603 A    7/1998  Jaeger
5,805,145 A *  9/1998  Jaeger ................. G02F 1/13306
                                                341/23

(Continued)

FOREIGN PATENT DOCUMENTS

CN    1702605    11/2005
CN    1722065    1/2006
(Continued)

OTHER PUBLICATIONS

Chinese Search Report dated May 20, 2016, Application No. 201380006149.4.
European Office Action dated Feb. 21, 2017, Application No. 13 704 995.3.

*Primary Examiner* — Insa Sadio
(74) *Attorney, Agent, or Firm* — Rankin, Hill & Clark LLP (57) ABSTRACT

Integrated control panel and electronic displays wherein the control panel may be positioned over the electronic display with at least part of the display being visible to the user. The control panel may consist of control elements such as rotary controls or buttons that can be associated with graphics on the display. Light emitters and detectors may be used to detect movement of the control elements such that the region of the display adjacent or juxtaposed to the control elements is not obscured from view of the user.

24 Claims, 9 Drawing Sheets

(51) Int. Cl.
*G06F 3/03* (2006.01)
*G06F 3/042* (2006.01)
*G06F 3/0362* (2013.01)
*H03K 17/969* (2006.01)
*G09G 5/36* (2006.01)
*G05G 1/08* (2006.01)
*H03K 17/94* (2006.01)

(52) U.S. Cl.
CPC .......... *G06F 3/0362* (2013.01); *G06F 3/0421* (2013.01); *G09G 5/363* (2013.01); *H03K 17/94* (2013.01); *H03K 17/969* (2013.01); *G09G 2320/10* (2013.01)

(58) Field of Classification Search
CPC .... G09G 2320/10; G09G 5/363; H03K 17/94; H03K 17/969
See application file for complete search history.

(56) References Cited

U.S. PATENT DOCUMENTS

| | | | |
|---|---|---|---|
| 8,026,827 B1* | 9/2011 | Boyd | B60K 37/02 200/313 |
| 2004/0212603 A1* | 10/2004 | Cok | G06F 3/0412 345/175 |
| 2005/0016824 A1 | 1/2005 | Olcott et al. | |
| 2008/0284724 A1 | 11/2008 | Alten | |
| 2009/0015549 A1 | 1/2009 | Gelfond et al. | |
| 2010/0150399 A1 | 6/2010 | Svajda et al. | |
| 2012/0249485 A1 | 10/2012 | Ye et al. | |

FOREIGN PATENT DOCUMENTS

| | | |
|---|---|---|
| EP | 1 501 007 | 1/2005 |
| EP | 1 585 020 | 10/2005 |
| FR | 2921168 | 3/2009 |

\* cited by examiner

CONTROL PANEL

TECHNICAL FIELD OF THE INVENTION

The present invention relates to control panels that allow interaction with electronic devices and machines and, more specifically combining controls with electronic displays.

BACKGROUND

A control panel can be connected a device (e.g. computer) and used as a method of physical interaction with the device. There are many applications where a control panel can be used, for example, sound and light applications (e.g. stage lighting, video editing, keyboards, DJ equipment), cars, factory equipment and machine controls.

A typical control panel is made up of controls such as knobs, faders buttons and display devices such as markings or legends, light emitting diodes (LED) or LCD displays. When a knob or button is moved, the control panel generates data which the device recognises, in turn, the control panel receives data from the device and displays information on its display devices. Control panels tend to be constructed using materials and techniques that make it difficult to change the appearance of the control panel after manufacture. As a result control panels are typically designed for one specific application so that the controls directly suit the device under control.

There are many situations where it is desirable to change the appearance of a control panel either after manufacture or during use. One example is when control panels are used in conjunction with audio software applications to emulate the control surface of a mixing desk. A typical audio software application has many functions and making a hardware control for every function parameter is impractical due to the high cost and amount of space that would be required. There are many examples of prior art that solve this problem by providing a small number of hardware controls that can change different software parameters dependant on the current mode of operation. However, the use of a control knob to adjust multiple parameters can lead to various problems.

- Control knobs typically have a visual indicator such as a line marked onto the knob so the user can tell the controls current position or value. This line cannot be updated by software and therefore when a control knob is used to represent multiple parameters, the line often becomes out of sync with the software parameter. Consequently, this visual indicator is not usually included. As a result it is difficult to know what the current position of the control is. This issue has been partly solved by providing a ring of LED's around the control knob, however, a ring of LED's only provides an approximate indication of the control knob's position and for many applications this is not accurate enough.
- A control knob typically has an associated scale (a set of ordered marks at fixed intervals used as a reference), and legend (name, title, unit of measurement etc. . . . ). Legends and scales surrounding hardware controls are usually painted or engraved onto the panel during manufacture and therefore cannot be changed at a later date. As a result any legends and scales have to be designed in a way that is appropriate for all parameters that the control knob intends to represent, this results in a generic and un-informative control panel. Consequently the user can find it difficult to know what each hardware control is currently controlling. Some control panels have partly solved this difficulty by providing a small LCD display next to the hardware control. The LCD display can show the control name, however, the scale cannot be changed. Other controls panels have partly solved this problem by locating controls close to, or over a large TFT display, however non-transparent connections are required to make the controls work and these connections obscure part of the screen from view.
- Software applications are often changed and updated. It is difficult to adapt any related hardware after it has been manufactured.
- It is difficult to design control panels that can be used for multiple devices or software programmes.

The following prior art, as described below, has partly solved some these difficulties, however some difficulties remain unsolved.

From U.S. Pat. No. 5,777,603, a device is known with a flat panel display which facilitates operation of one or more electrical circuit control devices. A rotatable and/or push able operated knob is attached to the face of the display within the image area of the display. The display has a light transparent zone within the image area which extends to the back of the display to enable photoelectric detection of the knob. Light is transmitted upwardly through the control knob and then is reflected downwards within the control knob to a detector. However this is contingent on a optical path through the display which has a number of disadvantages;

- The construction of such a display would be expensive, especially for large screens;
- A low cost, readily available, mass produced display could not be used;
- A control panel could not be retro-fitted to a system or computer where a standard screen already exists.
- No monitor containing a cathode ray tube can be used;

From patents US 2009/015549 A1 and EP1501007 A2 a device is known for accepting a user input comprising a display, a plate, a control knob positioned over the display, a light detector and a light emitter. The control knob comprises reflective stripes and the light detector is positioned to detect light reflected by the reflective stripes, the light beam reflects off the outer surface of the control knob. However this method of detecting movement, using reflective stripes, has the following disadvantages;

- It is not possible to arrange a large array of control knobs over a display such that one control knob does not interfere with the photoelectric detection of a second control knob; In applications such as audio mixing equipment it is advantageous to have many high resolution control knobs located in the smallest space possible. If this reflective method is deployed and many control knobs are positioned over a display, unintended reflections will occur making it difficult to detect which control knob is moving. This is particularly apparent when control knobs are positioned close together.
- The accuracy (or resolution) at which angular displacement of the control knob can be measured is not high enough for many applications. The achievable resolution is significantly less than a traditional potentiometer. The resolution can be increased by providing more reflective stripes, however the resolution is limited by the acceptable width of each stripe. As each strip becomes smaller less light is reflected and unintended reflection can occur. Further, if the separation distance between the control knob and the light devices is increased, the accuracy (or resolution) at which angular displacement of the control knob can be measured decreases.

A relatively large reflective strip is required in order to reflect enough light and avoid interference problems. This limitation restricts the size of control knobs such that only large control knobs can be used.

The light detector and light emitter must be positioned close to the control knob. Consequently a reflective configuration is only suitable for small displays or where control knobs are positioned close to the edge of a display. Since the proportion of light that is reflected back to the light detector, from the light emitter, decreases exponentially as the separation distance is increases, this detection method becomes susceptible to interference as the separation distance is increased;

SUMMARY OF THE INVENTION

To overcome these difficulties the present invention proposes a control panel, comprising; a viewing element which is in use positioned over a display which is configurable to display images, with at least part of the display being visible through the viewing element; at least two light controllers which are movably disposed to the viewing element, each light controller rotatable relative to the viewing element about an axis of rotation; at least two light emitters, each light emitter operable to deliver light across the viewing element to at least one of the at least two light controllers; and at least two light detectors, each light detector operable to detect light from at least one of the at least two light controllers; wherein; the at least two light emitters and the at least two light detectors are configured to form a grid of sensing paths across the viewing element; the at least two light controllers are scanned by sequentially activating the at least two light emitters and the at least two light detectors; the light detected by the at least two light detectors is representative of movement of the at least two light controllers and utilized to configure the image as displayed by the display.

The advantages achieved by this arrangement can be seen in the particular ability to dispose many light controllers to the viewing element in close proximity and their movement detected without photoelectric interference. Thus, a large array of controls can be disposed to the viewing element so that a region of the display adjacent or juxtaposed to the light controls is not obscured from view of the user.

In one embodiment of the invention, light delivered across the viewing element to a light controller is transmitted in a direction across the light controllers, the direction being substantially parallel to the plane of the viewing element. Further advantages achieved by this arrangement can be seen in particular in the ability to measure, to a high resolution, angular displacement of the light controller without requiring the light emitter or light detector to be positioned in close proximity to the light controller.

Preferably the light controllers include a feature, wherein the feature provides the transmitted light with a characteristic which is representative of movement of the respective light controller.

Light emitters and the light detectors are preferably positioned around the edge of the viewing element so that they do not obscure the display from view of the user.

Preferably, the display displays graphics that relates to the light controllers.

BRIEF DESCRIPTION OF THE DRAWINGS

The invention will now be described solely by way of example and with reference to the accompanying drawings in which.

DETAILED DESCRIPTION

Figure 1:
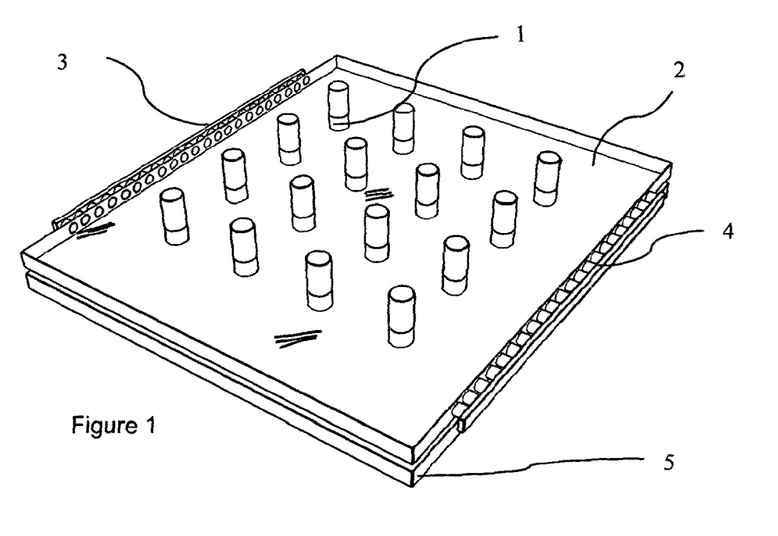
FIG. 1 shows light controllers, a viewing element, light emitters and light detectors, the viewing element being positioned over a display.

In FIG. 1, a control panel includes light controllers 1, a viewing element 2, light emitters 3 and light detectors 4. The viewing element is designed to be positioned over a display 5 (e.g. Liquid Crystal Display (LCD), thin film transistor (TFT), plasma, Organic Light Emitting Diode (OLED), Electronic Paper, video projector and projection screen, or other display etc.) such that the display can be viewed by the user through the viewing element. The viewing element is preferably a plate constructed from an optically transparent material (e.g. clear plastic, acrylic plastic, glass, etc.). The light controllers are disposed to the viewing element (disposed to means that light controllers are placed through, on, or within the viewing element). The light controllers are rotatable relative to the viewing element. The light emitters are operative to deliver light across the viewing element to at least one of the light controllers. The light detectors are operative to detect light from at least one of the light controllers, the detected light being representative of movement of the light controller that the light was received from.

Figure 2:
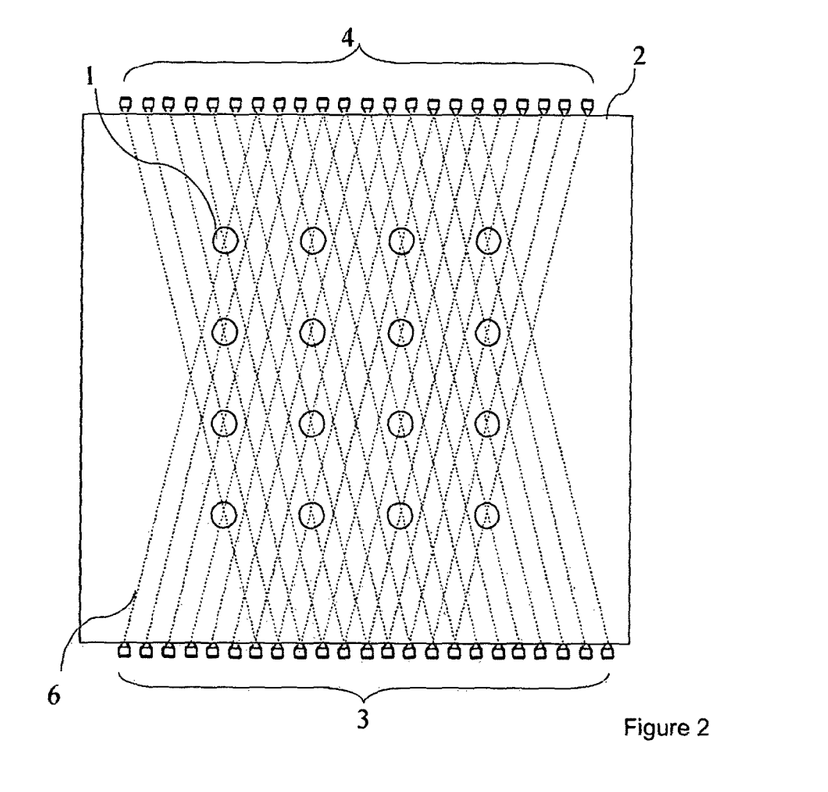
FIG. 2 shows light emitters and light detectors configured to form a grid of sensing paths across the viewing element.

The light detectors and light emitters are configured to form a grid of sensing paths 6 across the viewing element. Sensing paths are formed from a light emitter and light detector pair. Grid means two or more intersecting sensing paths. Optionally, each light emitter can be configured to deliver light to more than one light controller and each light detector can be configured to receive light from more than one light controller. FIG. 2 shows a plan view of the control panel according to one embodiment of the invention, the grid of sensing paths is depicted in FIG. 2 by dotted lines.

Light controllers that are coupled to or from part of a control knob or other control member (e.g. rotary control, button, linear slider control etc. . . . ) are considered within the scope of this invention.

In one embodiment of the invention a light controller is rotatable relative to the viewing element about an axis of rotation, preferably the axis of rotation is substantially perpendicular to the plane of the viewing element.

In one embodiment of the invention the light emitters and light detectors emit and detect either infra-red (IR) light, visible light or ultra-violet (UV) light.

In one embodiment of the invention the light emitters are light emitting diodes (LED's) and the light detectors are photoelectric detectors (e.g. phototransistors, photodiodes, Charge-coupled device (CCD) etc. . . . ). Optionally the light emitters deliver infra-red light and the light detectors detect infra-red light.

In one embodiment of the invention the light controllers are positioned at locations where two or more sensing paths intersect. This arrangement results in the ability to deduce both rotational movement and direction of rotation. Optionally the light controllers are positioned at locations where more that two sensing paths intersect so that movement of light controllers can be measured to a higher resolution.

Figure 3:
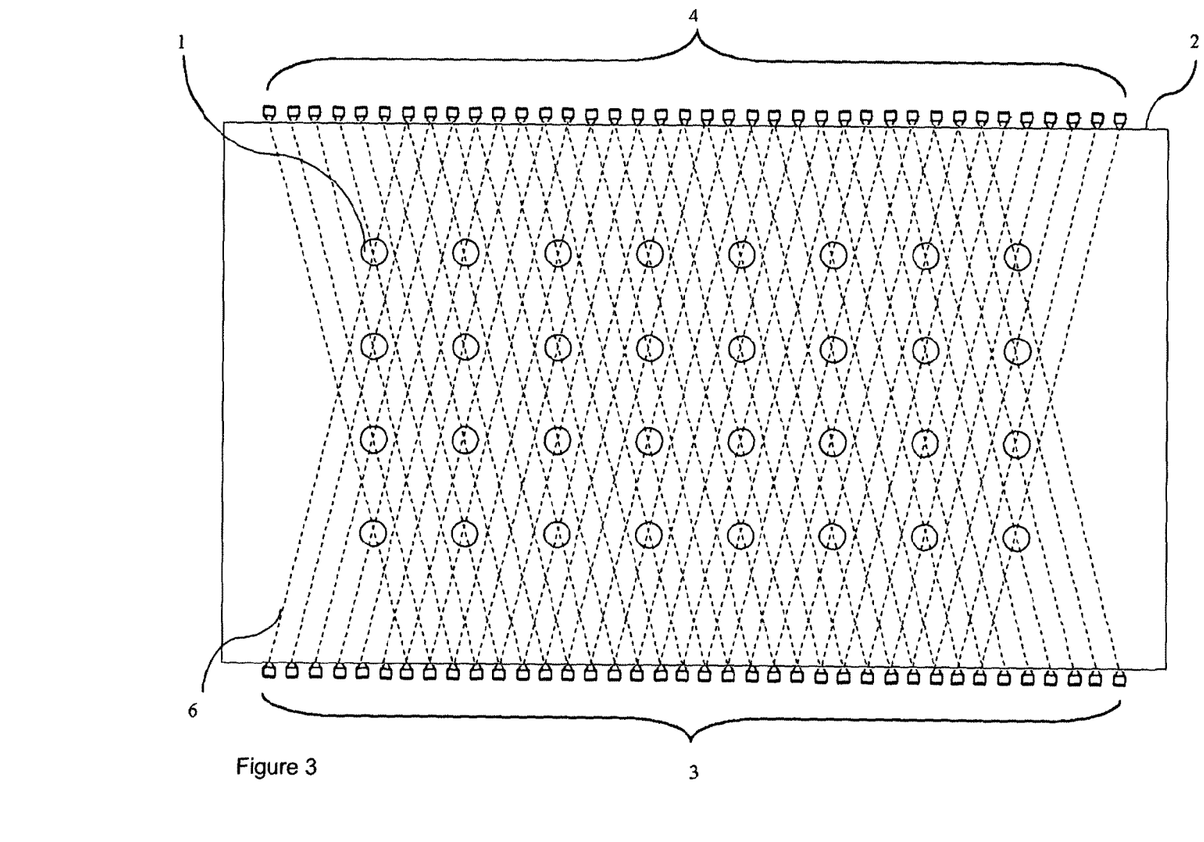
FIG. 3 shows a control panel with many light controllers.

FIG. 3 shows another embodiment of the invention in which a large array of light controllers are disposed to the viewing element, the grid of sensing paths is also depicted in FIG. 3 using dotted lines. Control panels comprising a large number of light controllers require a large number of light emitters and light detectors. FIG. 3 illustrates one arrangement whereby each light emitter is configured to deliver light to more than one light controller and each light detector is configured to receive light from more than one light controller thus reducing the number of required light detectors and light emitters.

Many alternative methods for configuring the light emitters and the light detectors as a grid of sensing paths are possible. Such alternative configurations are considered within the scope of this invention.

Figure 4:
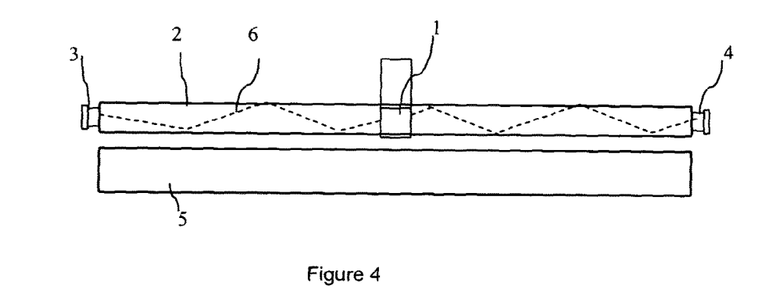
FIG. 4 shows a viewing element acting as a light guide.
Figure 5:
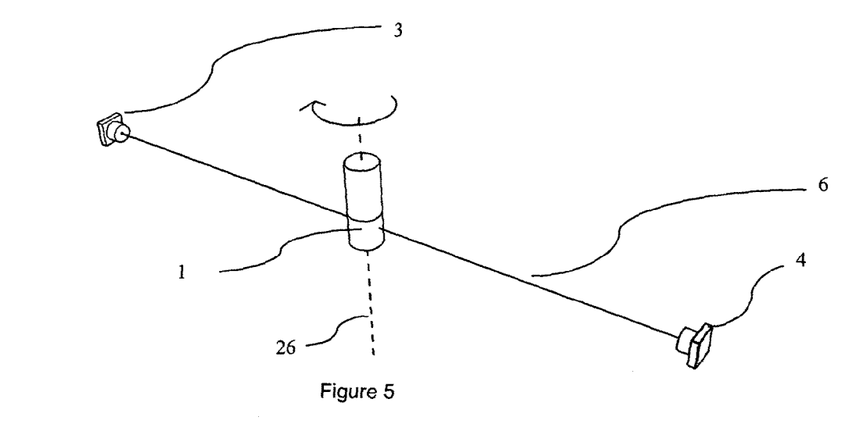
FIGS. 5, 6, 7 8 and 9 shows a light controller further comprising a plurality of light altering elements, arranged around the axis of rotation of the control member. These figures also provide an example of how the light altering elements affect light passing through the light controller as the member is rotated.

In one embodiment of the invention the light (or sensing path) delivered across the viewing element to a light controller is transmitted across the light controller in a direction substantially parallel to the plane of the viewing element. In this arrangement the light travels across the viewing element, enters the control member and then exits the control member, an example of this arrangement is show in FIG. 4. In FIG. 4 some light is shown to be reflected internally within the light guide and light controller, however the general (or average) direction of the transmitted light is still parallel to the viewing element. The light is then delivered across the viewing element to one or more of the light detectors. Preferably at least a portion of light detected by an associated light detector, is transmitted directly across the light controller without being reflected. The advantages achieved by this arrangement can be seen in particular in the ability to measure, to a high resolution, angular displacement of the light controller without requiring the light emitter or light detector to be positioned in close proximity to the light controller. Additionally many light controllers can be disposed to the viewing element in close proximity and their movement detected without photoelectric interference. Thus, a large array of controls can be disposed to the viewing element so that a region of the display adjacent or juxtaposed to the light controllers is not obscured from view of the user. Optionally the light (or sensing path) is transmitted through more than one light controller, this is considered within the scope of the invention.

In another embodiment of the invention, the light (or sensing path) delivered across the viewing element to a light controller is transmitted in a straight line through the light controller, such that a portion of light detected by an associated light detector, is transmitted across the light controller without being reflected.

In one embodiment of the invention, a control panel operates as follows; a light emitter is activated and light (e.g. infra-red light) is delivered to a light controller. A portion of this light will reach the light controller where a further portion of the light is either attenuated or deflected by the light controller. The amount of attenuation or deflection varies depending on the angular position of the light controller. A light detector then detects the amount of light from the light controller. The light emitter is then deactivated, and another light emitter activated. This process is repeated such that light controllers are scanned by sequentially activating the light emitters and the light detectors. By sequentially activating the light emitters and the light detectors, the grid of sensing paths can be scanned without unwanted interactions between light emitters and light detectors and the movement of each light controller can be deduced. The scanning of light controllers is repeated and the movement of each light controller calculated by comparing output signals from the light detectors.

FIG. 4 shows one embodiment of the invention in which the light emitters are configured to deliver light through the viewing element and the light detectors are configured to receive light from the viewing element, the viewing element acting as a light guide.

In another embodiment of the invention the light emitters and the light detectors are disposed to an edge of the viewing element.

In yet another embodiment of the invention the light emitters and/or the light detectors are optically coupled to the viewing element by at least one light guide or at least one reflective element.

In other embodiments of the invention light emitters and light detectors are disposed directly above or below the viewing element, the light being projected across the viewing element, either above or below the viewing element.

A variety of alternative methods for directing light between the light emitters and the light controllers, or between light controllers and light detectors has been considered. Use of reflective material or light guides to direct the light between the light emitters and the light controllers, or between light controllers and light detectors is considered within the scope of the invention. The following paragraphs provide some example configurations.

In one embodiment of the invention, a reflective member is positioned between the light emitter and the light controller such that the light is projected towards the light controller by an indirect route, similarly in another embodiment of the invention reflective members are positioned between a light controller and a light detector.

In another embodiment of the invention, the control panel further comprises one or more light guide elements that direct light, after passing through a light controller, towards common points. Light detectors are then located at the common points, thus reducing the number of light detectors required. The light guide elements are constructed from one or more light guides, reflective surfaces and/or lenses.

Figure 17:
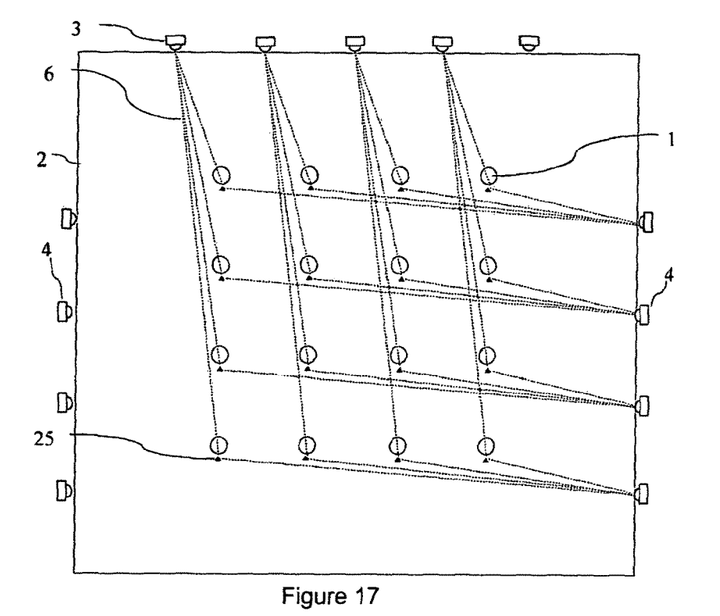
FIGS. 17 and 18 show an example of reflective material being used to direct light between the light controllers and the light detectors.
Figure 18:
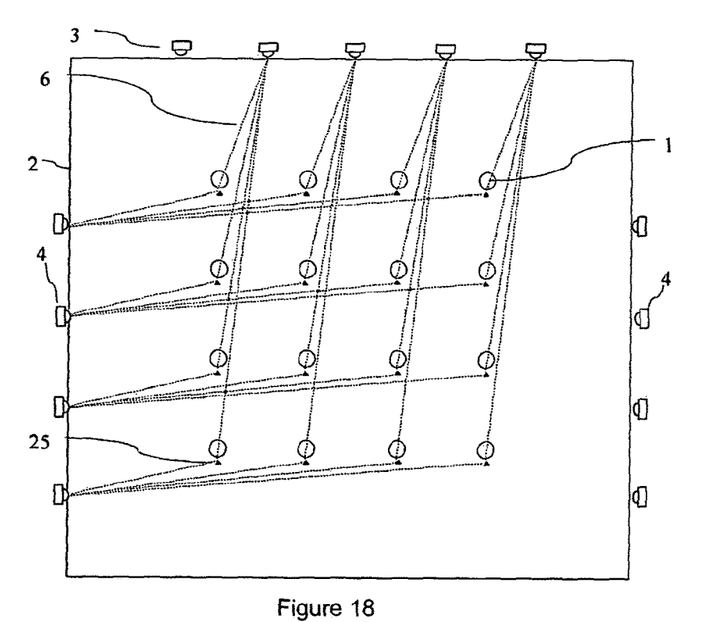

FIGS. 17 and 18 show yet another embodiment of the invention in which light guides are integrated into the viewing element. The viewing element is constructed from a material that is optically transmissive such as acrylic or glass. A number of slots or grooves are constructed into the viewing element such that they create a series of reflective surfaces 25. The reflective members direct light from the light emitters to the light controllers. The grid of sensing paths, depicted using dotted lines, has been shown using two figures to simplify the drawing, FIG. 17 shows sensing paths from the light emitters on the right side, FIG. 18 shows sensing paths from the light emitters on the left side.

Control panels may comprise of many light controllers and thus the time required to scan the control panel may cause latency problems. In one embodiment of the invention, the viewing element is divided into one or more sections, where each section acts as an independent light guide. Light paths can be transmitted independently through each section such that faster scan rates can be achieved. For example, a first light emitter and detector are positioned to deliver and detect light through a first section. A second light emitter and detector are positioned deliver and detect light through a second section. The first light emitter and detector pair can transmit and receive light without interference from the second light emitter and detector pair.

In one embodiment of the invention light controllers further include a feature which provides the transmitted light with a characteristic which is representative of movement of the light controllers.

Figure 6:
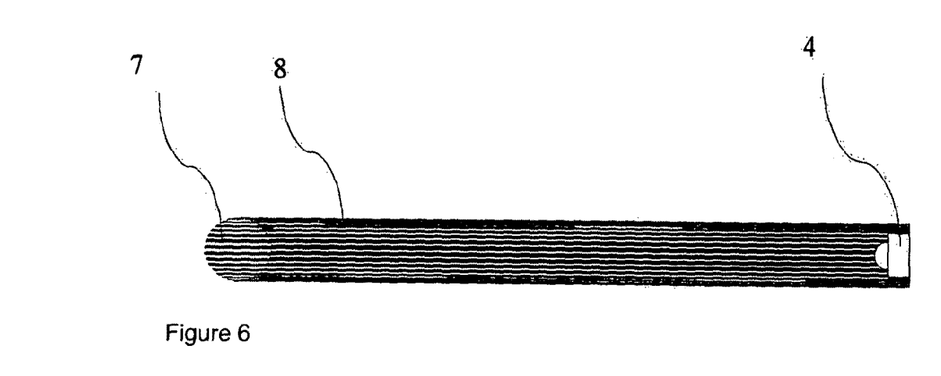

FIGS. 5, 6, 7, 8 and 9 show one embodiment of the invention wherein a feature comprises a plurality of light altering elements 7, arranged around the axis of rotation of the respective light controller. Only one light controller, light emitter and light detector are shown to aid clarity. The amount of light passing across the control member is dependant on the relative alignment between the light altering members on opposite sites of the axis of rotation. The light altering elements can be made from light reflecting, light refracting, light absorbing materials, or lenses etc. . . . The light altering elements can be positioned on or within the light controller. FIG. 6 shows a cross section through the light controller, light emitter and light detector from FIG. 5.

Figure 7:
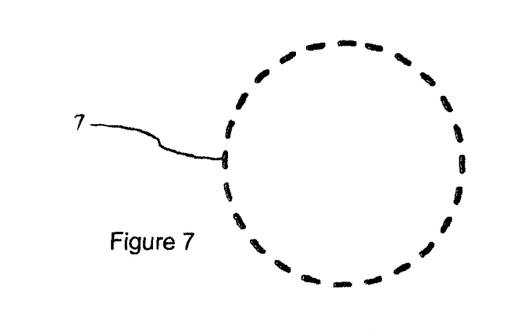
Figure 8:
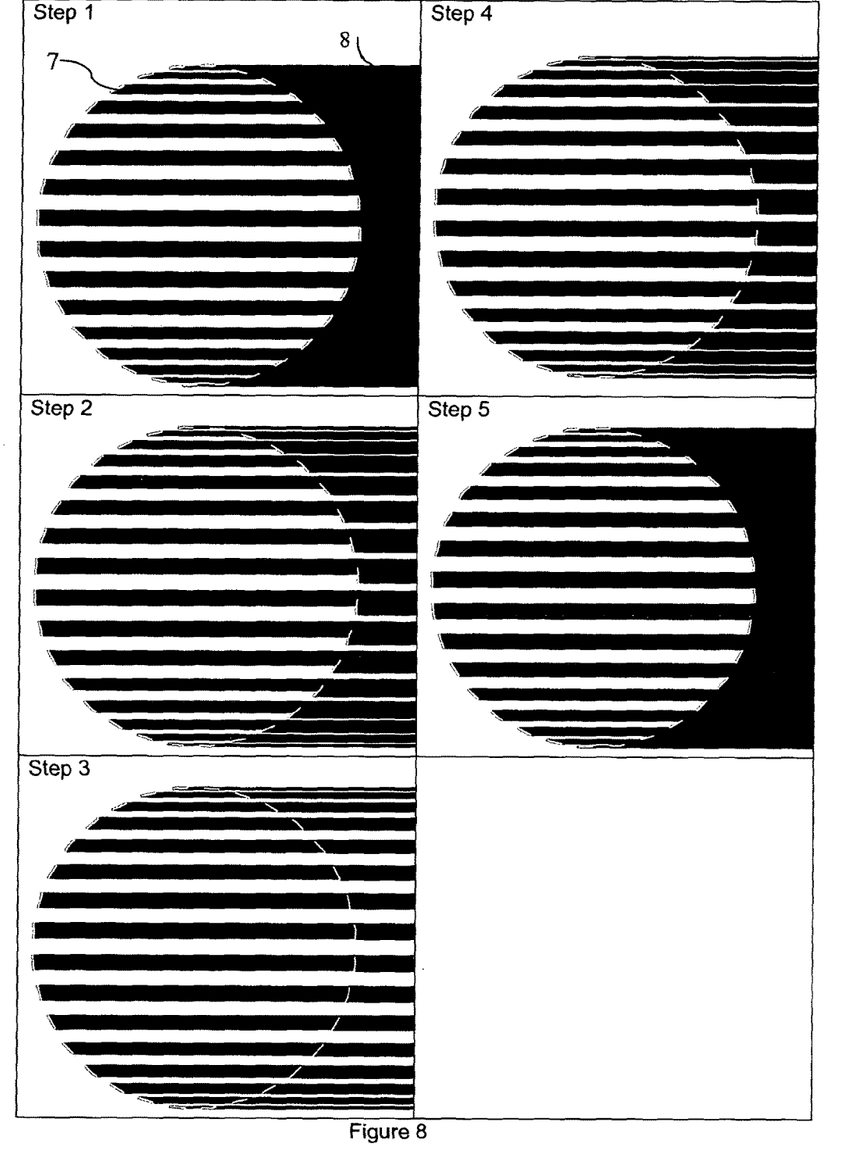
Figure 9:
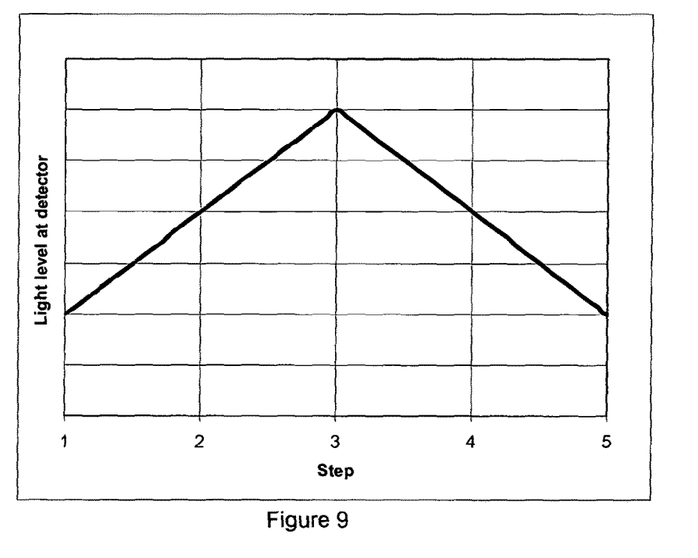

FIGS. 7 and 8 show a magnified view of the rotary control member from FIG. 6. FIG. 7 shows the light altering elements arranged around the axis of rotation 26. FIG. 8 provides an example of how the light altering elements affect light passing through the light controller as the control member is rotated. In each step, the light controller is rotated in the anti-clockwise direction. Preferably the light altering elements create multiple narrow beams 8 (or shadows), the width of each beam changes with rotation of the light controller. The alignment of altering elements on opposite sites of the control member dictates the width of each beam and thus the amount of light passing across. Preferably the light passes through two surfaces of the light controller and on rotation these surfaces move in opposite directions. This configuration means that on rotation, two light pulses are generated for every altering member as opposed to only one, therefore the resolution at which angular displacement can be measured is effectively doubled. The graph in FIG. 9 shows the light received by the light detector at each step. Another key advantage of this configuration is the particular ability to increase the number of light altering members (and therefore resolution) without reducing the amount of light transmitted across the rotary control member.

Figure 10:
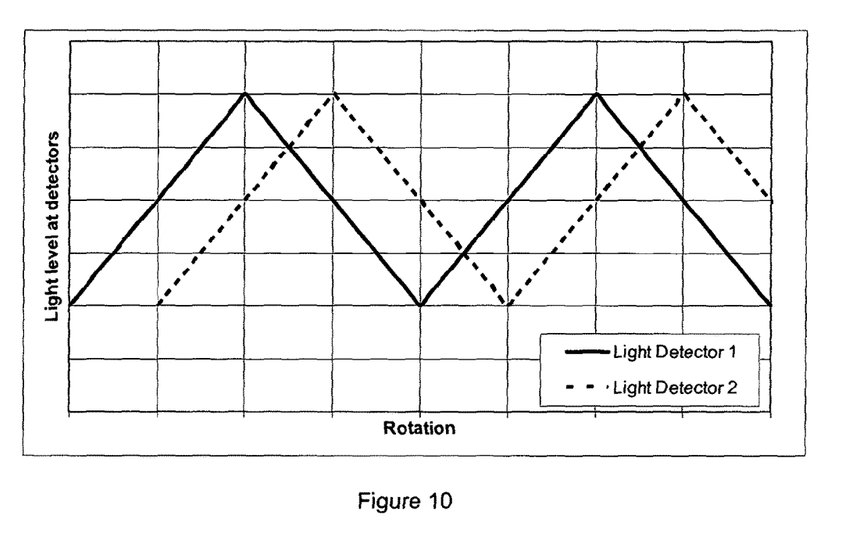
FIG. 10 shows a graph displaying the output signal of two light detectors on rotation of a light controller.

The graph in FIG. 10 shows one embodiment of the invention where, on rotation of a light controller, two light detectors output a repeating signal with a phase difference. Preferably the light emitters and light detectors are configured so that the grid of sensing paths is such that there is approximately a 90 degree (or 270 degree) phase difference between the two signals. Angular displacement and direction of rotation are calculated from the two output signals using well known mathematical techniques.

The light controller as depicted in FIGS. 5,6,7,8, and 9 produces a series of narrow light beams (or shadows). Optical detection of these narrow beams can be difficult. To solve this problem, one embodiment of the invention compromises one or more diffusers. Diffusers are positioned between light controllers and light detectors such that the narrow light beams are diffused into a single beam, before reaching the light detector. The diffusers can be made from a material that causes light to diffuse as light passes through the material, (e.g. semi-opaque plastic, tracing paper etc.) or from a diffused surface (e.g. a bumpy surface on the edge of the plate, diverging lenses etc.). The diffusers also reduce the accuracy at which the light emitters, light detectors and light controller have to be positioned.

There are many ways in which the light controller can be constructed. Light controllers that include a feature that provides the light detectors with light which is representative of movement of the light controllers are considered within the scope of the invention. Optionally the feature can be located on or within light controllers. The following paragraphs provide some example constructions for the light controllers.

Figure 11:
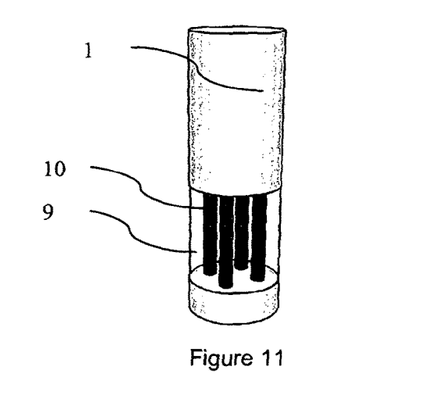
FIG. 11 shows one method for constructing the light controller.

FIG. 11 shows one method for constructing the light controller. The light controller includes a column 9 containing optically transmissive elements (e.g. acrylic, Perspex, air etc.), the column also contains a number of non-transparent elements 10 that block light. As the light controller is rotated, alignment of the non-transparent elements changes so that the amount of light that can pass through changes.

Figure 12:
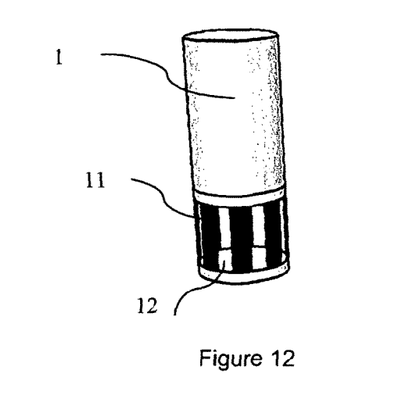
FIG. 12 shows another method for constructing the light controller.

FIG. 12 shows an alternative method for constructing the light controller. The light controller includes a column 11 containing optically transmissive elements. A number of non-transparent elements 12 (e.g. paint, label, plastic etc.) are fixed to the surface of the column. Light from a light emitter is transmitted across the light controller. As the light controller is rotated, alignment of the non-transparent elements changes so that the amount of light that can pass across changes.

Figure 13:
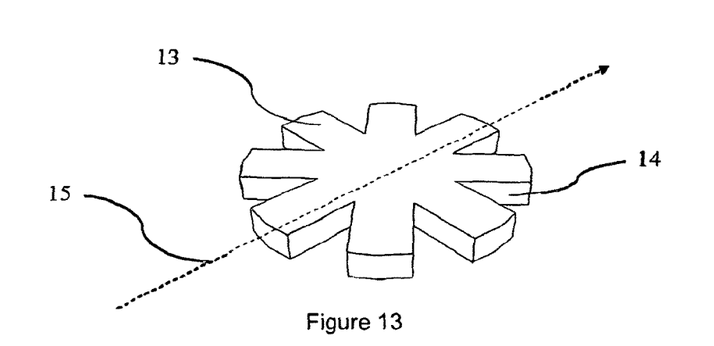
FIG. 13 shows yet another method for constructing the light controller.
Figure 14:
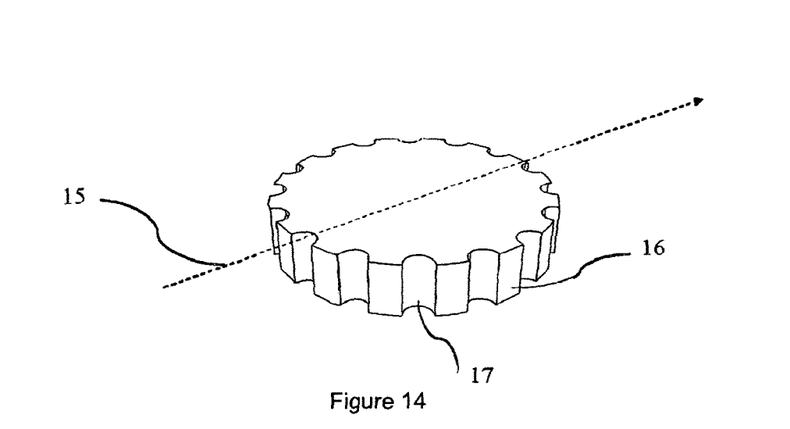
FIG. 14 shows yet another method for constructing the light controller.

FIG. 13 shows another alternative method for constructing the light controller. The light controller includes a circular member 13 constructed of an optically transmissive material. The light controller also includes one or more deflective surfaces 14 configured at an angle such that when light strikes these surfaces reflection and/or refraction occur. Light from a light emitter is transmitted across the light controller as shown by the dotted line 15. As the light controller is rotated, the amount of the light that can pass across changes, and therefore the amount of light reaching the associated light detector is attenuated.

FIG. 13 shows yet another method for constructing the light controller. The light controller features a circular member 16 constructed of an optically transmissive material. The control member also features one or more recesses 17 that are coated or filled with a non-transparent material (e.g. paint, label, plastic etc.). Light from a light emitter is transmitted across the light controller as shown by the dotted line 15. As the light controller is rotated, the amount of the light that can pass across changes.

There are many ways in which the light controllers can be disposed to the viewing element and/or constructed to form part of a control knob or other control member (e.g. rotary control, button, linear slider control etc.). Light controllers placed through, on or within the viewing element are considered within the scope of the invention. Light controllers attached to the viewing element via a supporting member are also considered within the scope of the invention. The following paragraphs provide some example configurations, however other configurations are also considered within the scope of this invention.

In one embodiment of the invention the light controllers are disposed to the viewing element using bearings, the bearings can be of any type (low friction washer, friction sleeve, rolling element bearing etc.).

In another embodiment the light controller is coupled to a control knob, button or linear slider.

Figure 15:
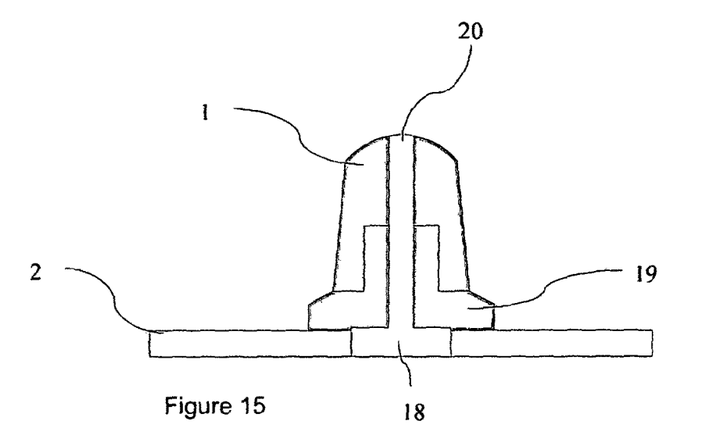
FIG. 15 shows a method for mounting the light controller to the viewing element.

FIG. 15, shows another embodiment of the invention in which the light controller is mounted to the viewing element using a support 19. The support is fixed to the viewing element and allows the depth of the viewing element (or plate) to be reduced while still retaining rigidity. In this example the light controller is a circular member 18, which controls the amount of light passing across the light controller. Optionally a control knob can be mounted to the light controller.

In one embodiment of the invention the control panel further comprises at least one switch movably disposed to the viewing element, the switch being depressible relative to the viewing element, which is detected by at least one light detector.

In another embodiment of the invention the light controllers also have the function of a switch. The switch can be of the momentary type or the latch type, however the switch is preferably of the monetary type so that the status of the switch is only indicated by graphics on the display and therefore can be updated without physically moving the switch. The switch is depressible relative to the viewing element and movement of the switch is detected by at least one light detector.

In one embodiment of the invention the control panel comprises a converter operable to sequentially activate the light emitters, sequentially scan the light emitters and convert the output signal from the light detectors into a control signal representative of movement of the light controllers. Preferably the light detectors are scanned in a sequence that relates to the activation of the light emitters.

In one embodiment of the invention the converter is a circuit, the circuit is preferably positioned so that the display is not obscured from the view of the user. Preferably the converter includes a computer (microcontroller, field programmable gate array etc.).

The control panel may be utilised in a variety of environments and thus may encounter various ambient light conditions. Interference from unintended light sources such as ambient light could affect normal operation.

In one embodiment of the invention one or more techniques are employed to isolate the light detector from receiving light generated by unintended sources such as ambient light. Such techniques include optical coatings applied to the viewing element or use of light detectors that only detect a narrow band width of light (e.g. infra red light).

In another embodiment of the invention techniques such as electronic or software filtering are deployed to reduce interference from ambient light or other sources of interference.

In yet another embodiment of the invention the converter includes algorithms that reduce interference from unintended light sources such as ambient light that could affect normal operation. Optionally, the light detectors can also be used to measure ambient light, this ambient light information can be used by the algorithms to reduce interference.

Figure 16:
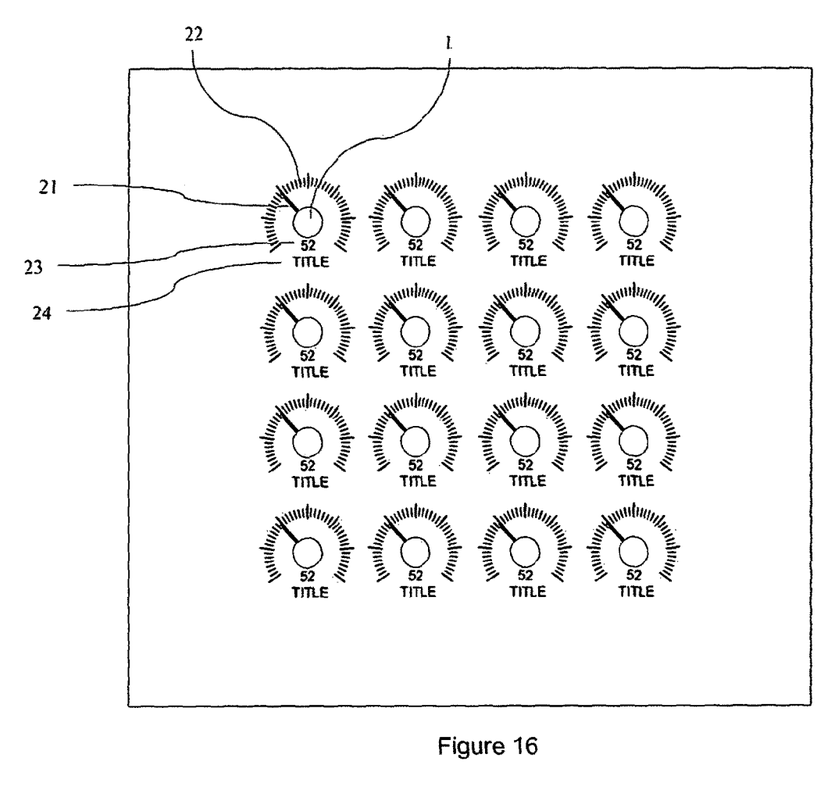
FIG. 16 shows a control panel positioned over a display, where the display shows graphics associated with each light controller, the graphics comprising scales, pointers, legends, and alphanumeric values.

FIG. 16 shows a further embodiment of the invention in which the display displays graphics that relates to the light controllers. The display is used to display any type of graphic relevant to the current application for which the control panel is being used. Examples of graphics include a line 21 that is updated such that the line appears to move with the light controller. Other examples of graphics include a scale 22, a alphanumeric value 23 and a title 24 for the control.

A further embodiment of the invention compromises a software application running on a computing device. The software application is responsive to a signal from the control panel and is operational to update the graphics on the display. For example, during use of the control panel, a user interacts with a rotational control member, the device generates signal representative of rotation of the light controller and direction of rotation. The software interprets the signal generated by the device and updates the graphics on the display.

In one embodiment of the invention, the software application is able to update the graphics on the display without physical re-configuration of the control member. Therefore the position of the light controller can be changed by the software so that physically moving the light controller is not required.

In one embodiment of the invention the graphics on the display are user configurable.

In one embodiment of the invention the control panel is connected to an external system. The external system could be a software application (e.g. software for audio, lighting, DJ, graphics, video, CAD, machine control etc. . . . ) or hardware (e.g. mixing desk, lighting desk, DJ equipment, a machine, factory equipment, vehicle etc. . . . ) When a user moves a light controller, the control panel generates data which the external system recognises, in turn the control panel receives data from the external system and displays information on the display.

In another embodiment of the invention the light detector is a image sensor (e.g. a CCD or CMOS sensor). The image sensor can detect movement of multiple light controllers.

Embodiments of the invention provide additional mechanisms for accepting user input such as buttons, knob's, fader's, LED's.

In one embodiment of the invention a projection surface is fixed to the viewing element and an image projector (or video projector) projects an image onto the viewing element from the rear of the control panel.

In one embodiment of the invention the display screen is visible through the light controller. FIG. 15 shows one example in which the display screen is visible through the light controller. In this example the central column is made from an optically transmissive material.

In another embodiment of the invention the light controller has a projection surface on the surface of the light controller such that the display can project a graphic onto the light controller. The light controller also includes an optically transparent path to allow light from the display to reach the projection surface.

A further embodiment of the invention compromises haptic feedback. Optionally, haptic sensations can be generated by a haptic feedback device, examples of this include click or dent sensations such that the light controller appears to operate as a rotary switch, clicks that relate to a scrolling through a list or menu, centre point of a parameter under control, maximum or minimum setting of a parameter under control.

The invention claimed is:

1. A control panel, comprising:
   a viewing element which is in use positioned over a display,
   wherein the display is configurable to display images and at least part of the display is visible through the viewing element;
   at least one light controller which is movably disposed to the viewing element,
   wherein the light controller is rotatable relative to the viewing element about an axis of rotation;
   at least two light emitters,
   wherein each light emitter is operable to deliver light across the viewing element to the at least one light controller; and
   at least two light detectors,
   wherein each light detector is operable to detect light from the at least one light controller;
   wherein the at least two light emitters and the at least two light detectors are configured to:
   form a grid of sensing paths with two or more intersecting sensing paths across the viewing element; and
   wherein the light detected by the at least two light detectors is representative of movement of the at least one light controller and utilized to configure the image as displayed by the display,
   wherein at least a portion of light detected by at least one light detector is transmitted across the at least one light controller without being reflected by the at least one light controller.

2. The control panel of claim 1, wherein the at least one light controller is scanned by activating the at least two light emitters or the at least two light detectors.

3. The control panel of claim 1, wherein the at least one light controller is scanned by sequentially activating the at least two light emitters or the at least two light detectors.

4. The control panel of claim 1, further comprising at least one diffuser.

5. The control panel of claim 1, further comprising at least one diffuser which is positioned between the at least one light controller and at least one of the at least two light detectors such that one or more light beams are diffused before reaching at least one of the light detectors.

6. The control panel of claim 1, further comprising at least one diffuser, wherein at least a portion of light emitted from at least one of the at least two light emitters is affected by the at least one diffuser.

7. The control panel of claim 1, wherein the at least one light controller is positioned where two or more sensing paths intersect.

8. The control panel of claim 1, wherein the light delivered across the viewing element to the at least one light controller is transmitted in a direction across the at least one light controller.

9. The control panel of claim 1, wherein the light delivered across the viewing element to the at least one light controller is transmitted in a direction which is substantially parallel to the plane of the viewing element.

10. The control panel of claim 1, wherein at least a portion of light delivered to the at least one light controller is transmitted through the respective light controller.

11. The control panel of claim 1, wherein the at least one light controller extends at least partially through the viewing element.

12. The control panel of claim 1, further comprising at least one switch movably disposed to the viewing element wherein the at least one switch is depressible relative to the viewing element, which is detectable by at least one light detector.

13. The control panel of claim 1, wherein the at least one light controller is depressible relative to the viewing element, which is detectable by at least one light detector.

14. The control panel of claim 1, wherein the at least two light emitters are configured to deliver light through the viewing element and the at least two light detectors are configured to receive light through the viewing element with the viewing element acting as a light guide.

15. The control panel of claim 1, wherein the viewing element further comprises at least one light deflector.

16. The control panel of claim 1, wherein the viewing element further comprises at least one light deflector and wherein the at least one light deflector is reflective for directing light indirectly between at least two of the following:
   at least one of the at least two light emitters,
   the at least one light controller, and
   at least one of the light detectors.

17. The control panel of claim 1, wherein the at least one light controller includes a feature, wherein the feature provides the transmitted light with a characteristic which is representative of movement of the at least one light controller.

18. The control panel of claim 17, wherein the feature comprises one or more of the following elements disposed around the axis of rotation of the respective light controller:
   light transmitting elements and non-light transmitting elements; and
   light attenuating elements.

19. The control panel of claim 1, further comprising a converter configured to convert at least two output signals from the at least two light detectors into a control signal representative of movement of the at least one light controller.

20. The control panel of claim 19, wherein the converter further provides a control signal representative of a direction of movement of the at least one light controller, which is determined by comparison of the output signals of the at least two light detectors.

21. The control panel of claim 19, wherein upon rotation of the at least one light controller, the at least two light detectors output repeating signals with a phase difference.

22. The control panel of claim 21, wherein the grid of sensing paths is configured such that there is approximately a 90 degree or a 270 degree phase difference between the two repeating signals.

23. The control panel of claim 1, wherein the control panel comprises at least two light controllers.

24. A control system, comprising:
   a control panel, comprising:
   a viewing element which is in use positioned over a display,
   wherein the display is configurable to display images and at least part of the display is visible through the viewing element;
   at least one light controller which is movably disposed to the viewing element,
   wherein the light controller is rotatable relative to the viewing element about an axis of rotation;
   at least two light emitters,
   wherein each light emitter is operable to deliver light across the viewing element to the at least one light controller; and
   at least two light detectors, wherein each light detector is operable to detect light from the at least one light controller;

wherein the at least two light emitters and the at least two light detectors are configured to:

form a grid of sensing paths with two or more intersecting sensing paths across the viewing element; and wherein the light detected by the at least two light detectors is representative of movement of the at least one light controller and utilized to configure the image as displayed by the display, wherein at least a portion of light detected by at least one light detector is transmitted across the at least one light controller without being reflected by the at least one light controller; and a device which is controlled by an operation of the control panel.

* * * * *